United States Patent [19]

Sakano

[11] 4,379,209

[45] Apr. 5, 1983

[54] AUDIO AMPLIFIER

[75] Inventor: Hideki Sakano, Iwafunemachi, Japan

[73] Assignee: Tokyo Shibaura Denki Kabushiki Kaisha, Kawasakishi, Japan

[21] Appl. No.: 208,394

[22] Filed: Nov. 19, 1980

[30] Foreign Application Priority Data

Feb. 20, 1980 [JP] Japan .................................. 55-20099

[51] Int. Cl.³ ............................................... H03F 1/38
[52] U.S. Cl. .................................... 179/1 A; 179/1 F; 330/207 P; 330/298
[58] Field of Search ..................... 330/105, 112, 207 P, 330/291, 298; 179/1 A, 1 F, 175.1 A

[56] References Cited

U.S. PATENT DOCUMENTS 3,484,692 12/1969 Lode ..................................... 330/112
3,838,352 9/1974 Dolby et al. ......................... 330/105
4,236,118 11/1980 Turner ................................. 330/112

Primary Examiner—G. Z. Rubinson
Assistant Examiner—Randall P. Myers
Attorney, Agent, or Firm—Finnegan, Henderson, Farabow, Garrett & Dunner

[57] ABSTRACT

An audio amplifier having an auxiliary terminal for connection of a feedback line to the grounded terminal of a loudspeaker and including a circuit for protection against voltage overload on the amplifier and loudspeaker if the auxiliary terminal is inadvertently connected to the ungrounded terminal of the loudspeaker, or in case of malfunction of the feedback circuit. The protection circuit includes a signal generator activated by the closing of a power switch for producing a check signal for circuiting through the terminals of the loudspeaker to the auxiliary terminal and a controller sensitive to the voltage at the auxiliary terminal for controlling a switch for disconnecting the feedback line, if the voltage at the auxiliary terminal exceeds a predetermined value.

13 Claims, 5 Drawing Figures

AUDIO AMPLIFIER

FIELD OF THE INVENTION

This invention relates to an audio amplifier, and more particularly, to an audio amplifier which has a compensating circuit for a counter electromotive force of a loudspeaker connected to it.

BACKGROUND OF THE INVENTION

A great number of improvements in audio equipment, for example, amplifiers or loudspeakers, have been made to produce sound of higher fidelity. As a result, a recent amplifier or loudspeaker, individually, produces a good performance. However, when the amplifier and loudspeaker are combined, impedance mismatching between the amplifier and loudspeaker becomes a problem. That is, the impedance of the extension wires connecting the amplifier and the loudspeaker adds to the impedance of the loudspeaker so that an output impedance of the amplifier becomes difficult to match with the whole of the load impedance, including the impedance of the loudspeaker and the extension wires. In such an impedance mismatching condition, an output signal voltage of the amplifier, as well as a counter electromotive force voltage of the loudspeaker, arises across the loudspeaker terminals. The counter electromotive force voltage has non-linearity characteristics so that the loudspeaker is driven by an output signal voltage which is distorted by the counter electromotive force voltage.

Heretofore, an audio amplifier having a circuit automatically compensating a counter electromotive force of a loudspeaker by means of feedback has been rarely considered. Moreover, it has been found that users may inadvertently connect the audio amplifier to the wrong side of the loudspeaker resulting in the breakdown of the amplifier or the loudspeaker.

SUMMARY OF THE INVENTION

Accordingly, an object of the present invention is to provide an audio amplifier having a circuit compensating automatically for a counter electromotive force voltage of a loudspeaker connected to the audio amplifier and for preventing any abnormality in voltage caused by a misconnection from damaging the audio amplifier and the loudspeaker.

Another object of the present invention is to provide an audio amplifier having a circuit for protecting against any abnormality caused by a malfunction of a circuit compensating for a counter electromotive force voltage of a loudspeaker connected to the audio amplifier.

The objects of the present invention are accomplished by an audio amplifier for connection to a pair of terminals of a loudspeaker through like individual extension wires comprising a line input terminal, a line amplifier having an input terminal connected to the line input terminal, a line output terminal for connection to one of the terminals of the loudspeaker through one of the extension wires, a grounded terminal for connection to the other of the terminals of the loudspeaker through the other of the extension wires, an auxiliary terminal for connection to the grounded terminal of the loudspeaker, a positive feedback circuit connected between the auxiliary terminal and the input terminal of the line amplifier and apparatus for protecting the line amplifier and loudspeaker from damage by voltage overload including: (a) a first switch connected in series with the positive feedback circuit; and (b) controller means sensitive to the voltage at the auxiliary terminal for opening, or maintaining open, the switch when the voltage exceeds a predetermined value.

Preferably, the audio amplifier of the invention also includes a low voltage check signal generator and another switch including a first stationary contact connected to the output of the line amplifier, a movable contact connected to the line output terminal and controlled in response to a power switch for the audio amplifier, and a second stationary contact connected to the check signal generator, the controller means opening the first switch when the voltage at the auxiliary terminal exceeds the predetermined value.

In addition, it is preferred that the check signal is inaudible on the loudspeaker, but that the voltage of the check signal is higher than the predetermined value plus the total of the impedance of one of the like extension wires and the connection between the auxiliary terminal and the grounded terminal of the loudspeaker, and less than the latter total impedance, plus the impedance between the pair of terminals of the loudspeaker.

Additional objects and advantages of the present invention will become apparent to persons skilled in the art from a study of the following description of the accompanying drawings, in which:

DESCRIPTION OF THE PREFERRED EMBODIMENT

Figure 1:
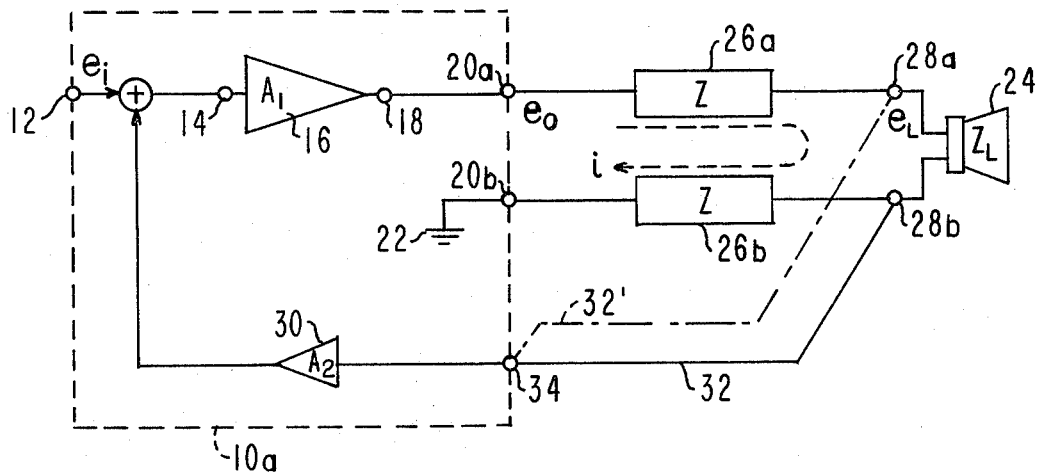
FIG. 1 shows a block diagram of a conventional sound reproduction system including a basic audio amplifier to which the present invention is an improvement.

The present invention will be described in detail with reference to the accompanying drawings FIG. 1 to FIG. 5. Throughout the drawings, like reference numerals will be used to designate like or equivalent portions, for the sake of simplicity of explanation.

Referring now to FIG. 1, there is shown a sound reproduction system including a prior art audio amplifier to which this invention is an improvement. In FIG. 1, an audio amplifier 10a within a broken line is characterized by having a positive feedback means. A line input signal at a line input terminal 12 is supplied to an input terminal 14 of a line amplifier 16. An amplified signal derived from an output terminal 18 of line amplifier 16 is supplied to a line output terminal 20a. Output terminal 20b is grounded. The line output signal arising across line output terminals 20a and 20b is supplied to a loudspeaker 24 through a pair of like extension wires 26a and 26b. One loudspeaker terminal 28b, which is connected to grounded output terminal 20b, is further connected to a positive feedback circuit 30 in audio amplifier 10a through a feedback wire 32 and through an auxiliary terminal 34. Thus, a signal voltage at loudspeaker terminal 28b is positively fed back to the input of line amplifier 16.

In the above-described sound reproduction system, positive feedback circuit 30 may compensate the driving signal for loudspeaker 24. That is, if $e_o$, $e_L$, $Z$ and $Z_L$ denote the output voltage of audio amplifier 10a, the driving voltage supplied to loudspeaker terminals 28a and 28b, the impedance of each of the like extension wires 26a or 26b, and the impedance of loudspeaker 24, respectively, then the following equation is obtained referring to the voltage $e_L$.

$$e_L = \frac{e_o \cdot Z_L}{2Z + Z_L} \quad (1)$$

If again, $e_i$, $i$, $A_1$ and $A_2$ denote an input signal voltage for audio amplifier 10a at line input terminal 12, output current flowing through extension wires 26a and 26b and loudspeaker 24, and amplification degrees of line amplifier 16 and positive feedback means 30, respectively, then the following equation is obtained referring to the voltage $e_o$:

$$e_o = (e_i + A_2 i Z) A_1 \quad (2)$$

$$= \left( e_i + A_2 Z \cdot \frac{e_o}{2Z + Z_L} \right) A_1$$

The equation (2) may be rearranged as follows:

$$e_o = \frac{e_i \cdot A_1}{\left(1 - A_1 \cdot A_2 \cdot \frac{Z}{2Z + Z_L}\right)} \quad (3)$$

Then, the equation (1) may be rewritten as follows by substituting the equation (3):

$$e_L = \frac{e_i \cdot A_1}{\left(1 - A_1 \cdot A_2 \cdot \frac{Z}{2Z + Z_L}\right)} \cdot \frac{Z_L}{2Z + Z_L} \quad (4)$$

$$= \frac{e_i \cdot A_1 \cdot Z_L}{Z_L + 2Z - A_2 A_1 Z}$$

In equation (4), the voltage $e_L$ persists regardless of loudspeaker impedance $Z_L$, under the condition that the following equation (5) is obtained:

$$2Z - A_i A_2 \cdot Z = 0,$$

that is, $\quad A_1 \cdot A_2 = 2 \quad (5)$

In the above equation, the voltage $e_L$ is presented by the special equation (6) as follows:

$$e'_L = A_1 \cdot e_i \quad (6)$$

From the relation (6), the following description may be made. That is, driving voltage $e'_L$ at terminals 28a and 28b for loudspeaker 24 relates only to the amplification degree $A_1$ of line amplifier 16 and does not relate to the loudspeaker impedance $Z_L$ and the impedance of extension wires 26a and 26b. This means that the sound reproduced from loudspeaker 24 is free from any distortion accompanying a change of the loudspeaker impedance $Z_L$.

However, it becomes clear that the sound reproduction system has a problem. That is, the whole system may be thrown into an abnormal oscillating condition by a violent positive feedback with the result that the loudspeaker or the line amplifier is damaged by an increased oscillating voltage. Such a situation arises when feedback wire 32 is connected to the ungrounded loudspeaker terminal 28a, as shown by a dotted line 32' in FIG. 1, whereby the feedback quantity by positive feedback circuit 30 becomes so large that the operative condition of the whole system goes into positive feedback condition. Then the following equation (7) is obtained:

$$e_o \approx A_1 \cdot (e_1 + A_2 \cdot e_o) \quad (7)$$

The equation (7) may be further changed as follows:

$$e_o = \frac{A_1}{1 - A_1 \cdot A_2} \cdot e_i$$

If the product $A_1 A_2$ is set for two, then the following equation (8) is obtained.

$$e_o = -A_1 \cdot e_i \quad (8)$$

Figure 2:
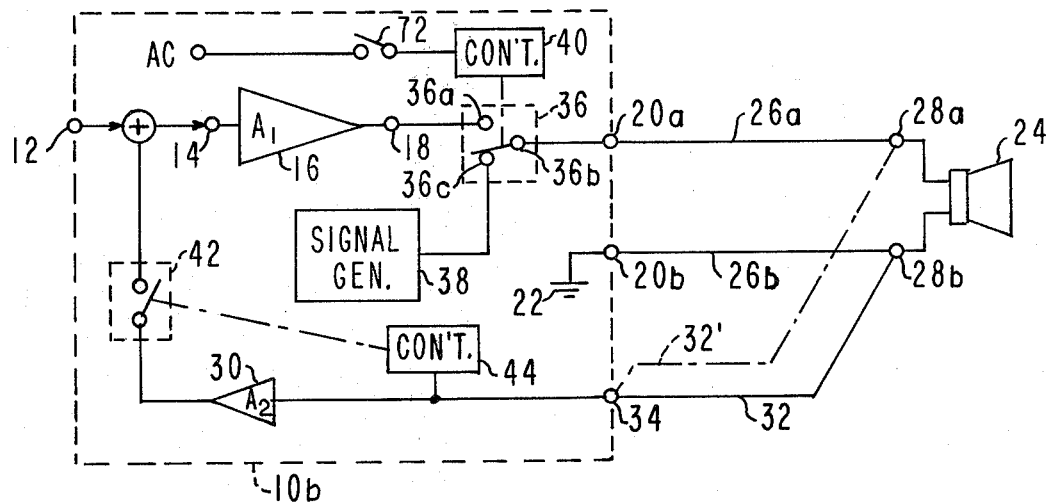
FIG. 2 shows a block diagram of a sound reproduction system including the audio amplifier according to the present invention.

Referring now to FIG. 2, there is shown in block diagram a sound reproduction system, including an audio amplifier according to this invention, in which a loudspeaker is connected to the audio amplifier. The audio amplifier is designated by a reference numeral 10b. Using FIG. 1, input terminal 12 is connected to input terminal 14 of line amplifier 16. Output terminal 18 of line amplifier 16 is connected to line output terminal 20a and output terminal 20b is grounded. Also as in FIG. 1, output terminal 20b is grounded. Also as in FIG. 1, output terminals 20a and 20b are connected to loudspeaker 24 via the pair of like extension wires 26a and 26b. One loudspeaker terminal 28b connected to grounded terminal 20b is further connected to positive feedback circuit 30 in audio amplifier 10b through feedback wire 32, and feedback wire 32 is connected between one loudspeaker terminal 28b and auxiliary terminal 34 of audio amplifier 10b. Then positive feedback circuit 30 is connected to input terminal 14 of line amplifier 16.

A single pole, double throw switch 36 is provided between output terminal 18 of line amplifier 16 and line output terminal 20a. A first stationary contact 36a of switch 36 is connected to output terminal 18 of line amplifier 16 and a movable contact 36b of switch 36 is connected to line output terminal 20a. Then, a second stationary contact 36c of switch 36 is connected to a check signal generator 38. Movable contact 36b is biased to second stationary contact 36c. A controller 40 is provided for the movable contact 36b. Controller 40 is electrically linked to a power supply switch 72 of audio amplifier 10b and activates movable contact 36b to be connected to first stationary 36a after a delay, as will be explained hereinafter. The delay is provided for muting the sound reproduction system for a short predetermined warm-up period before the signal from line amplifier 16 is applied to loudspeaker 24.

In addition, a single pole single throw switch 42 is provided between positive feedback circuit 30 and input terminal 14 of line amplifier 16. Then, second controller 44 is provided for second switch 42.

Second controller 44 is connected to auxiliary terminal 34 and activates second switch 42 to open when the voltage level on auxiliary terminal 34 exceeds a predetermined level.

Now the operation of the sound reproduction system shown in FIG. 2 will be explained. When power supply switch 72 is closed, movable contact 36b in double throw switch 36 is already connected to second stationary contact 36c by a bias on the movable contact. Therefore, a low voltage check signal is applied to loudspeaker 24 from check signal generator 38, as will be explained with reference to FIG. 3. The check signal flows to ground through extension wire 26a, loudspeaker 24 and extension wire 26b in order.

The voltage level of the check signal is set to be higher than the predetermined maximum permissible voltage at auxiliary terminal 34 plus the voltage drops resulting from the combined impedance of an extension wire 26a, 26b and the connection 32 between terminal 28b and auxiliary terminal 34, but less than the voltage drop across that combined impedance plus the voltage drop resulting from the impedance between the terminals 28a, 28b, of the loudspeaker.

Thus, if the line 32 is properly connected to terminal 28b, the voltage signal level of the check signal appearing at auxiliary terminal 34 will be less than the predetermined value and controller 44 will permit second switch 42 to maintain its ON condition. Then, first controller 40 moves movable contact 36b from stationary contact 36c to stationary contact 36a after the predetermined delay.

On the other hand, if line 32 is improperly connected to terminal 28a, the voltage appearing at auxiliary terminal 34 will exceed the predetermined value and controller 44 will open second switch 42 to disconnect positive feedback circuit 30 from input terminal 14 of line amplifier 16. However, controller 40 moves movable contact 36b from stationary contact 36c to stationary contact 36a after the predetermined delay. As a result, the sound reproduction system may operate as an ordinary sound reproduction system without the circuit compensating for a counter electromotive force voltage of a loudspeaker.

Figure 3:
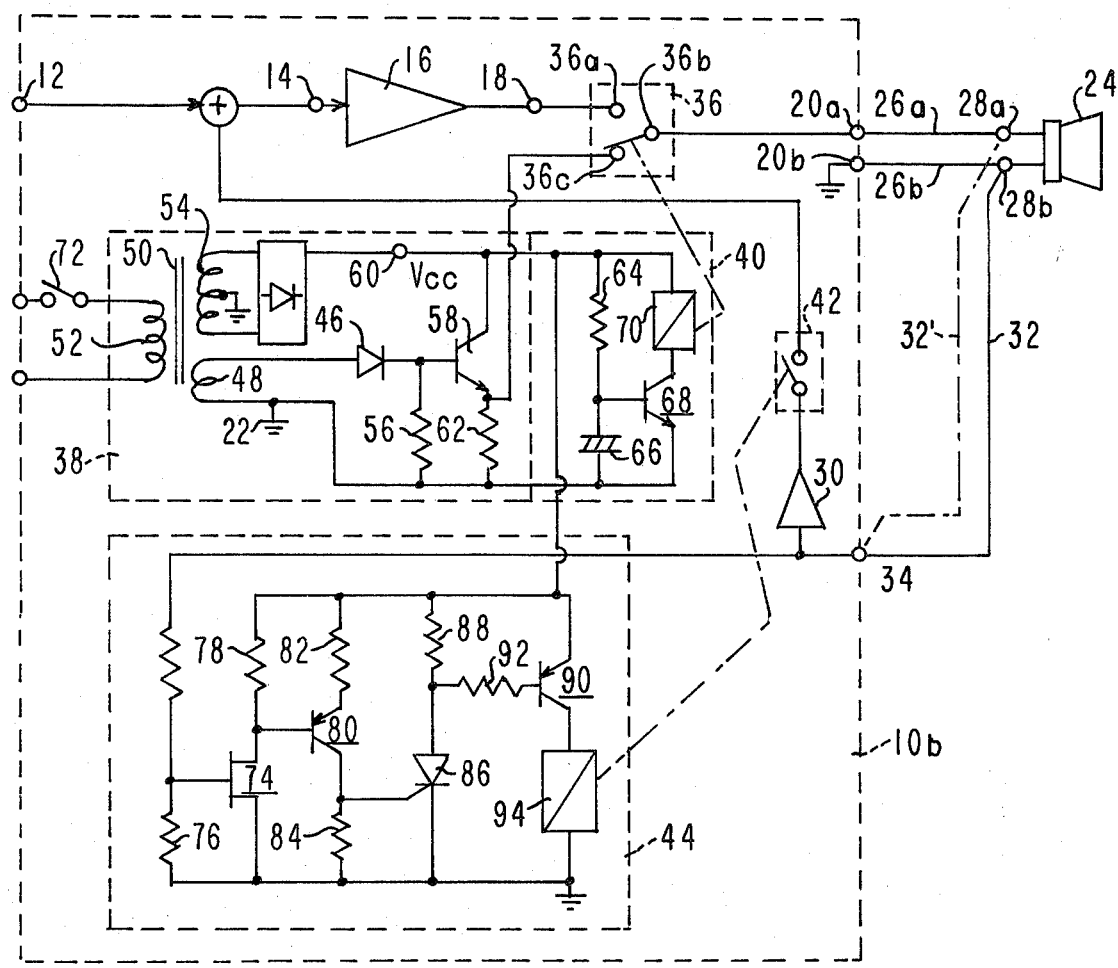
FIG. 3 shows a circuit diagram of a sound reproduction system including an audio amplifier which embodies the present invention.

FIG. 3 shows a circuit diagram of a sound reproduction system in which the check signal generator and the controllers for the audio amplifier according to the present invention are drawn in detail. Line amplifier 16, a single pole double throw switch (first switch) 36, a single pole single throw switch (second switch) 42, loudspeaker 24 and positive feedback circuit 30 are connected as shown in FIG. 2.

Check signal generator 38 connected to second stationary contact 36c of switch 36 is constructed as a halfwave rectifier circuit. That is, a diode 46 is coupled at its anode to a secondary winding 48 of a transformer 50 which has a primary winding 52 and another secondary winding 54. The cathode of diode 46 is connected to one end of a resistor 56 the other end of which is grounded, and also connected to the base of an NPN transistor 58. Transistor 58 is coupled at its collector to DC power source 60 having a voltage +Vcc and at its emitter to ground 22 through a resistor 62. The emitter of transistor 58 is also connected to second stationary contact 36c of switch 36.

Accordingly, a halfwave current rectified from a commercial AC power source is obtained on the cathode of diode 46. The halfwave current is properly regulated at its amplitude by transistor 58. Thus, the regulated halfwave current is supplied to second stationary contact 36c of switch 36 as a check signal.

A controller (first controller) 40 for double throw switch (first switch) 36 is constructed as stated below. One end of a resistor 64 is connected to DC power source terminal 60. The other end of resistor 64 is connected to ground 22 through a capacitor 66, and is also connected to the base of a NPN transistor 68. Transistor 68 is connected at its collector to DC power source 60 through a relay coil 70 and at its emitter to ground 22.

Accordingly, when power switch 72 inserted into the primary winding circuit of transformer 50 has been closed, charging for capacitor 66 is started. The charging current flows into capacitor 66 from DC power source 60 through resistor 64. Before the base potential of transistor 68 reaches a turn-on voltage, transistor 68 is in OFF state, and the relay-controlled contact, that is, the biased movable contact 36b of double throw switch 36, is still connected to second stationary contact 36c side since relay coil 70 has not yet been activated. Therefore, audio amplifier 10c is muted for a predetermined period. The muting period is determined by a time constant according to the resistance of resistor 64 and the capacitance of capacitor 66. The controller 40, which includes the resistor 64 and capacitor 66, may therefore be termed a delaying controller.

During the muting period, the check signal is supplied from the emitter of transistor 58 to line output terminal 20a through switch 36.

A controller 44 for second switch 42 is constructed as described below. The gate of a field-effect transistor (FET) 74 is connected to auxiliary terminal 34 and to one end of a resistor 76 of which the other end is grounded. FET 74 is coupled at its drain to DC power source 60 through a resistor 78 and at its source to ground 22. The drain of FET 74 is further connected to the base of PNP transistor 80. PNP transistor 80 is coupled at its emitter to DC power source 60 through a resistor 82 and at its collector to ground 22 through a resistor 84. The collector of transistor 80 is further connected to the gate of a silicon controller rectifier (SCR) 86. SCR 86 is coupled at its anode to DC power source 60 through a resistor 88 and at its cathode to ground 22. The anode of SCR 86 is further connected to the base of a PNP transistor 90 through a resistor 92. Transistor 90 is coupled at its emitter to the DC power source 60 and at its collector to ground 22 through a second relay coil 94.

Accordingly, during the muting period, the check signal produced by check signal generator 38 is supplied from the emitter of transistor 58 to the gate of FET 74 through switch 36, line output terminal 20a, extension wire 26a and feedback wire 32 in turn. Therefore, if feedback wire 32 is rightly connected to grounded terminal 28b of loudspeaker 24, the check signal comes out at auxiliary terminal 34 as low potential. So, transistors 74, 80 and 90 and SCR 86 are in OFF condition. Therefore, second relay coil 94 fails to be activated and second switch 42 maintains its ON condition.

After the muting period, transistor 90 is maintained in OFF condition because the output signal of line amplifier 16 comes out at auxiliary terminal 34 as low potential under the condition that feedback wire 32 is rightly connected to grounded terminal 28b of loudspeaker 24.

However, if feedback wire 32 is connected to ungrounded terminal 28a of loudspeaker 24 in error, as shown on the dotted line 32', the check signal is not affected by the impedance of the loudspeaker and comes out on auxiliary terminal 34 as relatively high potential in the muting period. So, transistors 74, 80 and 90 and SCR 86 turn to ON conditions. As a result, second relay coil 94 activated so as to open second switch 42. Hereupon, SCR keeps its ON condition by only one pulse in the halfwave current so that transistor 90 may also keep its ON condition. Therefore, second relay coil 94 is kept in active condition after the muting period. As a result, the dangerous positive feedback condition otherwise resulting from the misconnecting of feedback wire 32 to loudspeaker 24 is prevented. In addition, after the muting period, the sound reproduction system may operate as an ordinary sound reproduction system because positive feedback circuit 30 is disconnected to input terminal 14 of line amplifier 16.

Figure 4:
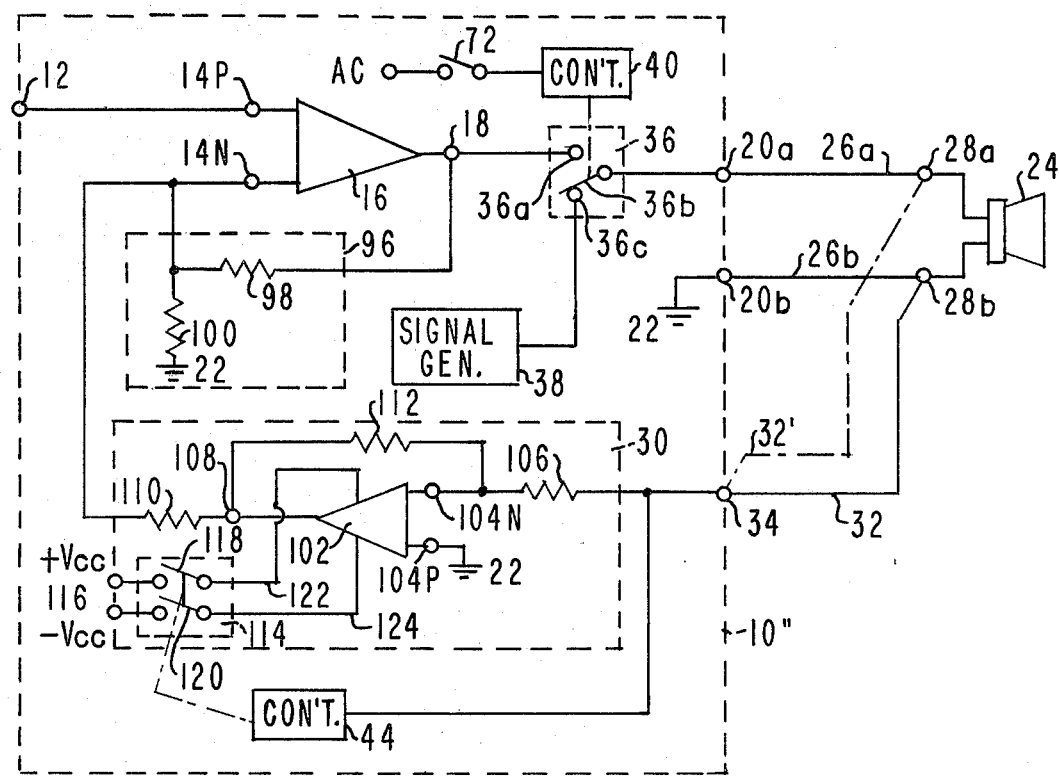
FIG. 4 shows a block diagram of a sound reproduction system including a second embodiment of an audio amplifier according to the present invention.

FIG. 4 shows a circuit diagram of a sound reproduction system which includes another embodiment of an audio amplifier according to the present invention. The audio amplifier is designated by a reference numeral 10''. Audio amplifier 10'' in FIG. 4 is different with audio amplifier 10b in FIG. 2 as follows. Line amplifier 16 has non-inverted and inverted input terminals 14P and 14N. To non-inverted input terminal 14P is connected line input terminal 12, and to inverted input terminal 14N is connected output terminal 18 of line amplifier 16 through a negative feedback circuit 96. Hereupon, the above-mentioned matter does not mean that line amplifier 16 in FIGS. 1 to 3 may not include any negative feedback circuit. Negative feedback circuit 96 comprises a series resistor 98 and a by-pass resistor 100. Positive feedback circuit 30, connected between auxiliary terminal 34 and input terminal 14N of amplifier 16 includes a feedback amplifier 102 also having a non-inverted and inverted input terminals 104P and 104N. Inverted input terminal 104N is connected to auxiliary terminal 34 through a resistor 106 and non-inverted input terminal 104P is connected to a ground 22. An output terminal 108 of the feedback amplifier 102 is connected to inverted input terminal 14N of line amplifier 16 through a resistor 110, and further connected to inverted input terminal 104N of feedback amplifier 102 through a resistor 112.

Controller 44 for positive feedback circuit 30 is connected to auxiliary terminal 34, and controls a switch 114 connected between feedback amplifier 102 and power source 116. Switch 114 has two movable contacts 118 and 120 which are respectively connected in positive source line 122 and negative source line 124.

In FIG. 4, if feedback wire 32 is properly connected to terminal 28b, the signal level of the check signal appearing at auxiliary terminal 34 will be less than the predetermined value and controller 44 will permit two movable contacts 118 and 120 of switch 114 to maintain their ON conditions. Therefore, positive feedback circuit 30 may compensate the counter electromotive force of loudspeaker 24.

On the other hand, if feedback wire 32 is connected to terminal 28a as shown on the dotted line 32' in errow, the voltage appearing at auxiliary terminal 34 will exceed the predetermined value and controller 44 will open switch 114 to deactivate feedback amplifier 102.

However, the series circuit of resistors 106, 112 and 110 survives and works as a very small negative feedback circuit in parallel with resistor 100 of negative feedback circuit 96. That is, an amplification degree $A_{NF}$ of line amplifier 16 with the paralled feedback is given as follows, $$A_{NF} = \frac{R_1 \quad (R_3 + R_4 + R_5)}{(R_1//R_3 + R_4 + R_5 + R_2 = R_1 + (R_3 + R_4 + R_5)} + R_2}{\frac{R_2}{R_1}} = \frac{R_1 \quad \quad R_2}{\frac{R_1}{R_1} + R_2}$$

$$= \frac{(\quad + 1)}{R_3 + R_4 + R_5}$$

$$R_2$$

wherein, $R_1$, $R_2$, $R_3$, $R_4$ and $R_5$ are the resistances of resistors 98, 100, 106, 110 and 112 respectively.

In the above equation, the value of $R_1/(R_3+R_4+R_5)$ may be considered as being nearly equal to zero. So that the amplification degree ANF becomes as follows, $$A_{NF} = \frac{R_1 + R_2}{R_2}$$

Accordingly, the amplification degree $A_{NF}$ of the line amplifier 16 during the time when the feedback amplifier 102 is deactivated may be kept almost equal to the amplification degree $A_{NF}$ when the positive feedback loop is open.

Figure 5:
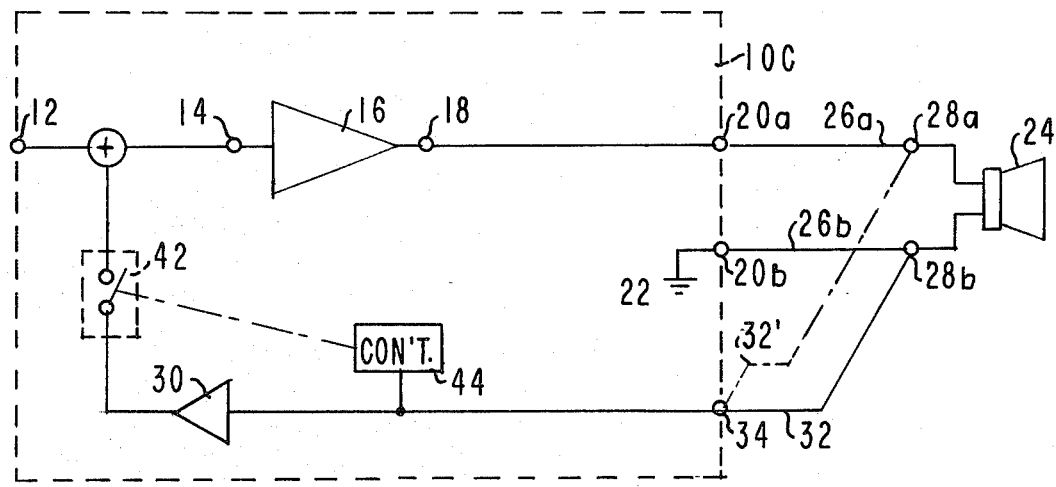
FIG. 5 shows a block diagram of a sound reproduction system including a third embodiment of an audio amplifier according to the present invention.

FIG. 5 shows another embodiment of an audio amplifier according to the present invention. Audio amplifier 10c shown in FIG. 5 is different from that of FIG. 2 in respect to the connection between output terminal 18 of line amplifier 16 and line output terminal 20a. That is, in FIG. 5, output terminal 18 of line amplifier 16 is directly connected to line output terminal 20a without using switch 36 as shown in FIG. 2. Accordingly, audio amplifier 10c does not include check signal generator 38 and controller 40 as shown in FIG. 2.

In audio amplifier 10c of FIG. 5, controller 44 operates in response to the output signal from line amplifier 16. Hereupon, if feedback wire 32 is connected to terminal 28a of loudspeaker 24 as shown on the dotted line 32 in errow, controller 44 will instantly open switch 42 as soon as the signal level of the output signal on auxiliary terminal 34 exceeds the predetermined value. As a result, line amplifier 16 and loudspeaker 24 are prevented from damage caused by a misconnection of the feedback line of the audio amplifier to the loudspeaker.

What is claimed is:
1. An audio amplifier for connection to a pair of terminals of a loudspeaker through like individual extension wires comprising:
 a line input terminal;
 a line amplifier having an input terminal connected to the line input terminal;
 a line output terminal for connection to one of the terminals of the loudspeaker through one of the extension wires;
 a grounded terminal for connection to the other of the terminals of the loudspeaker through the other of the extension wires;
 an auxiliary terminal for connection to the grounded terminal of the loudspeaker;
 a positive feedback circuit connected between the auxiliary terminal and the input terminal of the line amplifier; and apparatus for protecting the line amplifier and loudspeaker from damage by voltage overload including:
  (a) a first switch in the positive feedback circuit between the auxiliary terminal and the input terminal of the line amplifier; and
  (b) controller means sensitive to the voltage at the auxiliary terminal for opening, or maintaining open, said switch when the latter voltage exceeds a predetermined value.

2. The audio amplifier of claim 1 wherein said feedback circuit includes a positive feedback amplifier and said switch is connected in series with said positive feedback amplifier.

3. The audio amplifier of claim 1 wherein said feedback circuit includes a positive feedback amplifier and said switch is connected between a power source and said positive feedback amplifier.

4. The audio amplifier according to claim 2 or claim 3, the audio amplifier further comprising:
  means for supplying a low voltage check signal, a second switch including a first stationary contact connected to the output of the line amplifier, a movable contact connected to the line output terminal, and a second stationary contact connected to the check signal supplying means, and delaying controller means for connecting said movable contact to said second stationary contact after the line amplifier is connected to a power source.

5. The audio amplifier of claim 4 further comprising power means including transformer means cooperating with said check signal supplying means.

6. An audio amplifier according to claim 5 wherein said check signal is inaudible on said loudspeaker, but the voltage of the check signal is higher than the predetermined value plus the total of the voltage resulting from the impedance of one of said extension wires and said connection between said auxiliary terminal and the grounded terminal of the loudspeaker, and less than the voltage of the predetermined value and said total voltage plus the voltage resulting from the impedance between the pair of terminals of the loudspeaker.

7. An audio amplifier according to claim 6 wherein said inaudible signal is a low frequency range signal.

8. An audio amplifier according to claim 6, wherein said inaudible signal is a halfwave rectified current of a commercial frequency current.

9. An audio amplifier according to claim 6 wherein said inaudible signal is a direct current.

10. An audio amplifier according to claim 4 wherein said check signal is inaudible on said loudspeaker, but the voltage of the check signal is higher than the predetermined value plus the total voltage drop resulting from the impedance of one of said extension wires and said connection between said auxiliary terminal and the grounded terminal of the loudspeaker, and less than the voltage of the predetermined value and said total voltage plus the voltage drop resulting from the impedance between the pair of terminals of the loudspeaker.

11. An audio amplifier according to claim 10 wherein said inaudible signal is a low frequency range signal.

12. An audio amplifier according to claim 10, wherein said inaudible signal is a halfwave rectified current of a commercial frequency current.

13. An audio amplifier according to claim 10, wherein said inaudible signal is a direct current.

* * * * *